United States Patent
Blakborn

(10) Patent No.: US 7,438,593 B2
(45) Date of Patent: Oct. 21, 2008

(54) COMPONENT FOR A PRINTED CIRCUIT BOARD AND METHOD FOR FITTING A PRINTED CIRCUIT BOARD WITH THIS COMPONENT

(75) Inventor: Willem Blakborn, Inzell (DE)

(73) Assignee: Rosenberger Hochfrequenztechnik GmbH & Co. KG, Fridolfing (DE)

( * ) Notice: Subject to any disclaimer, the term of this patent is extended or adjusted under 35 U.S.C. 154(b) by 290 days.

(21) Appl. No.: 10/564,470

(22) PCT Filed: Jul. 7, 2004

(86) PCT No.: PCT/EP2004/007440

§ 371 (c)(1),
(2), (4) Date: Jan. 13, 2006

(87) PCT Pub. No.: WO2005/006821

PCT Pub. Date: Jan. 20, 2005

(65) Prior Publication Data

US 2006/0201702 A1    Sep. 14, 2006

(30) Foreign Application Priority Data

Jul. 14, 2003   (DE) ............................... 103 31 840

(51) Int. Cl.
*H01R 13/73* (2006.01)
(52) U.S. Cl. .................. 439/571; 439/83; 439/876; 439/66; 439/591; 174/262
(58) Field of Classification Search ............... 174/260, 174/262; 439/83, 571, 876

See application file for complete search history.

(56) References Cited

U.S. PATENT DOCUMENTS

| 4,541,034 | A |   | 9/1985  | Fanning et al. |
| 5,295,862 | A |   | 3/1994  | Mosquera et al. |
| 5,410,452 | A | * | 4/1995  | Sinclair et al. ............... 361/791 |
| 5,571,033 | A | * | 11/1996 | Kinsey et al. ................ 439/595 |
| 5,589,669 | A | * | 12/1996 | Downes et al. .............. 174/266 |
| 6,159,045 | A | * | 12/2000 | Vicich ......................... 439/571 |
| 6,179,631 | B1 |  | 1/2001 | Downes et al. |
| 7,275,315 | B2 | * | 10/2007 | Modinger .................... 29/843 |

FOREIGN PATENT DOCUMENTS

| DE | 41 32 996 A1 | 11/1992 |
| EP |  0 872 919 A | 10/1998 |

(Continued)

*Primary Examiner*—Dean A. Reichard
*Assistant Examiner*—Hoa C Nguyen
(74) *Attorney, Agent, or Firm*—Lowe Hauptman Ham & Berner LLP

(57) ABSTRACT

A printed circuit board component includes a housing carrying a peg that engages a printed circuit board hole. This peg has a radially projecting detent lug extending beyond the plug outer periphery. The lug is located and formed on the peg so the peg outer periphery is smaller in the area of the lug than the diameter of the hole. The outer periphery of the section of the peg projecting into the hole is such that, between the outer periphery of this section and the hole inner wall, a space having a capillarity for solder is formed over a portion of the outer periphery. During soldering, solder on the printed circuit board surface enters and fills the space by capillary action.

16 Claims, 1 Drawing Sheet

FOREIGN PATENT DOCUMENTS

| | | | |
|---|---|---|---|
| GB | 2 259 613 A | 3/1993 |
| JP | 03 095962 A | 4/1991 |
| JP | 09 219581 A | 8/1997 |
| WO | 2005/006501 A | 1/2005 |

\* cited by examiner

COMPONENT FOR A PRINTED CIRCUIT BOARD AND METHOD FOR FITTING A PRINTED CIRCUIT BOARD WITH THIS COMPONENT

RELATED APPLICATIONS

The present application is national phase of PCT/EP2004/007440 filed Jul. 7, 2004 which is based on, and claims priority from, German Application Number 103 31 840 A1, filed Jul. 14, 2003, the disclosures of which are hereby incorporated by reference herein in their entirety.

FIELD OF THE INVENTION

The present invention relates to a component for a circuit board, having a housing on which at least one peg is designed for engaging in a hole in the circuit board, whereby the peg has at least one detent lug which projects in the radial direction relative to the peg beyond its outer periphery. The invention also relates to a method for inserting a component of this type into a circuit board.

BACKGROUND OF THE INVENTION

In order to equip a circuit board with components, for some components, it is necessary additionally to fasten them mechanically to the circuit board with a peg having a latching device. By this means, the peg penetrates a hole in the circuit board, whereby a detent lug on the penetrating end of the peg latches onto the side of the circuit board opposed to the component and thereby mechanically fixes the component once it has been inserted. It is, however, disadvantageous herein that the placement force alone is 10 N, which cannot be achieved with conventional component inserting machines. This applies all the more to the force required for latching, which is usually in the range of 60 N to 110 N. Therefore, formerly such components have had to be inserted and latched manually. However, this entails a high cost.

It is an object of the invention to improve a component and a method of the aforementioned type such that fitting and locking of this component in a circuit board can be carried out by machine reliably and at low cost.

SUMMARY OF THE INVENTION

According to one aspect of the invention, a circuit board component of the aforementioned type includes a detent lug designed and arranged on the peg such that the outer periphery of the peg is smaller in the region of the detent lug than the diameter of the hole in the circuit board, whereby the outer periphery of the section of the peg protruding into the hole in the circuit board is designed such that between the outer periphery of this section and the inner wall of the hole in the circuit board, over at least a portion of the outer periphery there is an intermediate space with capillarity for solder, such that solder situated on the surface of the circuit board during a soldering procedure penetrates by capillary action into the intermediate space, filling it.

According to another aspect of the invention, a circuit board component is bonded to a circuit board by applying soldering paste on the circuit board round at least a portion of the periphery of a hole, placing the component onto said circuit board with the peg in the hole in said circuit board, heating the solder arranged round the hole such that the solder penetrates by capillary action into the intermediate space with capillarity, and cooling the solder which has penetrated into the hole, such that it hardens.

This has the advantage that for fitting and locking the component on the circuit board, it is not necessary to apply a particularly great force, so that this work can be carried out automatically by machine in a production line for circuit boards with a component inserting machine and a hot air furnace, whereby after the soldering procedure in the hot air furnace, locking of the component is automatically achieved by the solder that has penetrated into the hole in the circuit board. At the same time, a tolerance-free form-fit takes place between the peg and the inner periphery of the hole in the circuit board in a plane of the circuit board. The insertion of components with locking can therefore be carried out very economically, simultaneously producing large holding forces and with little tolerance.

A form-fitting connection without tolerance in the direction along a longitudinal axis of the hole in the circuit board is thereby achieved that the detent lug is designed and arranged on the peg such that with the component placed fully on the circuit board, the detent lug is arranged within the hole in the circuit board.

For further promotion of the capillary action, the periphery of the peg is designed in the longitudinal direction over the whole section situated in the hole in the circuit board with at least one cut-out.

A particularly good form-fit between the solder penetrating into the hole in the circuit board and the circuit board is thereby achieved that the hole in the circuit board is metallised.

The peg is made, for example, of plastics, so that no mechanically strong connection between said peg and the solder arises.

BRIEF DESCRIPTION OF THE DRAWINGS

The invention will now be described in greater detail by reference to the drawings, in which.

DETAILED DESCRIPTION OF THE DRAWINGS

Figure 1:
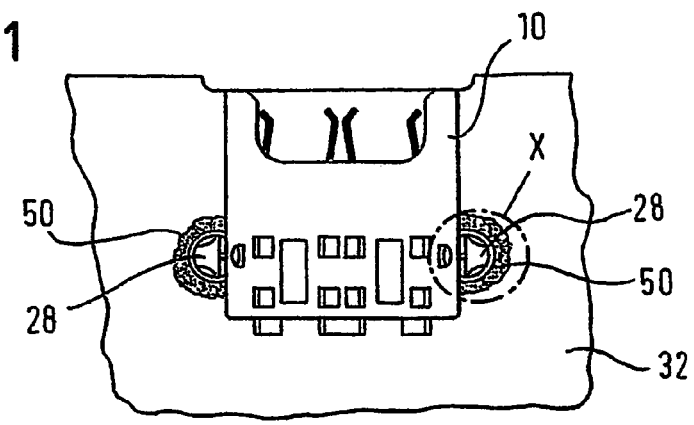
FIG. 1 shows a plan view of a preferred embodiment of a component placed on a circuit board.

FIG. 1 shows a preferred embodiment of a component for a circuit board 32. The component comprises a housing 10 onto which two pegs 28 are formed. In FIG. 1, the component is placed on the circuit board 32, whereby each peg 28 engages in a metallic hole 30 in the circuit board 32.

Figure 3:
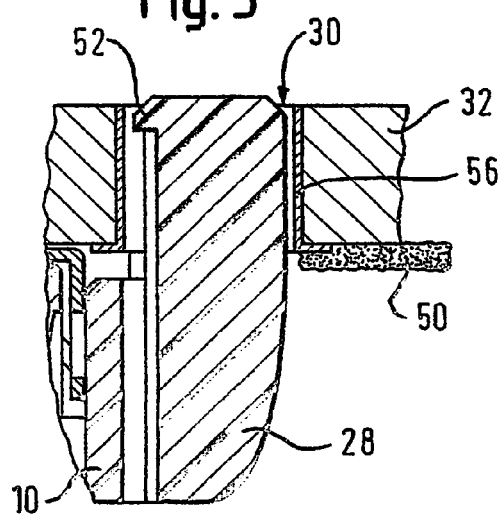
FIG. 3 shows a sectional view along the line A-A of FIG. 2.
Figure 2:
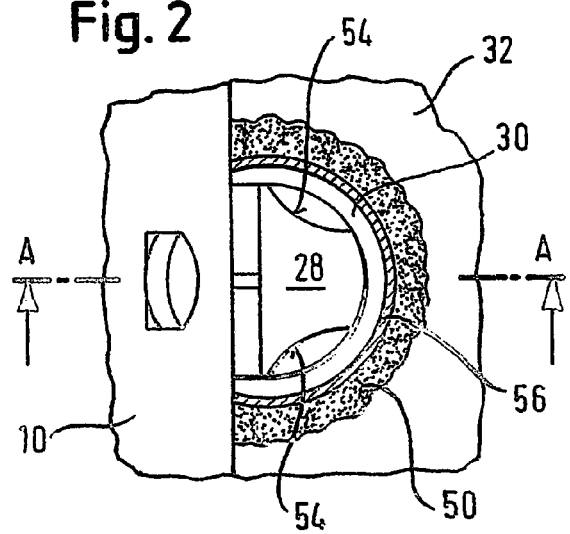
FIG. 2 shows a view of the detail X of FIG. 1 before a soldering procedure.

FIGS. 2 and 3 additionally illustrate the condition of the component inserted into the circuit board before the soldering procedure, whereby metallising 56 of the hole 30 is visible. Soldering paste 50 is applied round a portion of the periphery of the hole 30 and the peg 28 protrudes into the hole 30. The peg 28 has a detent lug 52 formed at its free end, whereby the diameter of the peg 28 is smaller in the region of the detent lug 52 than the inner diameter of the hole 30. Also in the remaining section of the peg 28, which engages in the hole 30, the diameter of the peg 28 is designed to be smaller than the inner diameter of the hole 30. In addition, the length of the peg 28 is selected such that with the component placed fully into the circuit board 32, the detent lug 52 is still situated within the hole 30, as is apparent in particular in FIG. 3. Additionally, the peg 28 is provided with cut-outs 54 in the longitudinal direction, as shown in particular in FIG. 2. The smaller diameter of the peg 28 compared with the hole 30 and the cut-outs 54 are chosen such that between the outer periphery of the peg 28 and the inner periphery of the hole 30, an intermediate space with capillary properties is formed.

In a manufacturing process wherein firstly all components are placed by a component inserting machine into the circuit board 32 and subsequently a soldering procedure takes place in a hot air furnace, the solder 50 is heated and passes to the liquid phase. The liquid solder 50 then penetrates, by means of the capillary effect and additionally supported by an adhesion force, into the intermediate space between the outer periphery of the peg 28 and the inner periphery of the hole 30 and essentially fills it completely. Before the soldering procedure, the solder 50 is herein arranged on non-metallised regions round the hole 30, whereby corresponding adhesive forces are produced in the direction of the hole 30.

Figure 5:
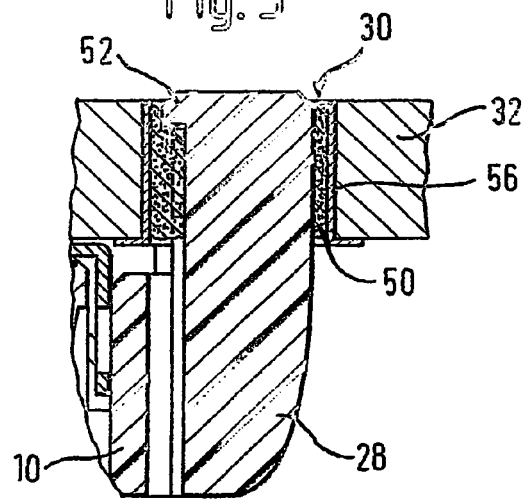
FIG. 5 shows a sectional view along the line B-B of FIG. 4.
Figure 4:
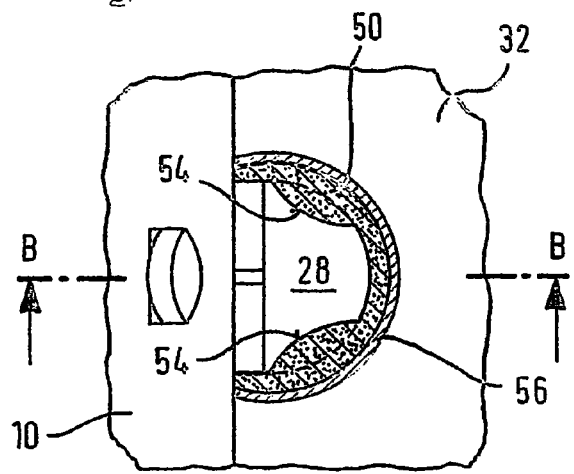
FIG. 4 shows a view of the detail X of FIG. 1 after a soldering procedure.

FIGS. 4 and 5 show the condition following cooling and hardening of the solder 50. The intermediate space is filled with solder 50 and the solder 50 has become bound to the metallising 56 of the hole 30 in form-fitting manner. This alone produces a form-fitting connection between the circuit board 32 and the peg 28 in a plane of the circuit board 32. Additionally, by means of the detent lug 52, a form-fit in the direction of the longitudinal axis of the hole 30 is produced, that is, in a direction perpendicular to the circuit board 32. Overall, therefore, the peg 28 is firmly connected or locked to the circuit board 32 in all three spatial directions. This connection is also able to absorb turning moments without the peg 32 becoming loosened from the hole 30. As is immediately apparent, however, no insertion force or latching force has to be applied to achieve this. Locking has been automatically achieved during the soldering procedure. It is also apparent that the connection between the peg 28 and the circuit board 32 is tolerance-free.

The invention claimed is:

1. Component for a circuit board, the component comprising a housing including at least one peg for fitting into a hole in the circuit board; the peg having at least one detent lug which projects in the radial direction relative to the peg beyond the peg outer periphery; the detent lug being arranged on the peg such that the outer periphery of the peg is smaller in the region of the detent lug than the diameter of the hole in the circuit board; the outer periphery of the section of the peg protruding into the hole in the circuit board being such that between the outer periphery of the peg section and the inner wall of the hole in the circuit board, over at least a portion of the outer periphery, there is an intermediate space with capillarity for solder, such that solder situated on the surface of the circuit board during a soldering procedure penetrates by capillary action into the intermediate space and fills the intermediate space, the periphery of the peg in the longitudinal direction over its entire portion located in the hole in the circuit board including at least one cut-out.

2. Component according to claim 1, wherein the detent lug is arranged on the peg such that with the component placed fully on the circuit board, the detent lug is within the hole in the circuit board.

3. Component according to claim 2, wherein the hole in the circuit board is metallised.

4. Component according to claim 3, wherein the peg is made of plastics.

5. Component according to claim 1, wherein the periphery of the peg in the longitudinal direction over the entire portion located in the hole in the circuit board includes at least one cut-out.

6. Component according to claim 1, wherein the hole in the circuit board is metallised.

7. Component according to claim 1, wherein the peg is made of plastics.

8. Method of inserting the component of claim 1 into the circuit board of claim 1, the method being performed by applying soldering paste on the circuit board around at least a portion of the periphery of the hole, placing the component into said circuit board with the peg in the hole in said circuit board, heating the solder around the hole such that the solder penetrates by capillary action into the intermediate space with the capillarity, and cooling the solder which has penetrated into the hole, such that the solder which has penetrated into the hole hardens.

9. The method of claim 8 wherein the solder paste is applied to a bottom surface of the circuit board.

10. The component of claim 1 wherein the intermediate space is in the form of a longitudinal recess in the peg.

11. An electrical component arrangement comprising:
a circuit board having (a) a non-metallised surface and (b) a hole with a first wall, the hole being in the surface and the first wall being metallised;
a component having a peg fixedly located in the hole; the peg having a second wall spaced from and extending in the same direction as the metallised first wall, the metallised first wall and the second wall being spaced such that solder located on the non-metallised surface around and immediately beyond the metallised first wall, when heated to a liquid, can flow by capillary action into and fill the space between the metallised first wall and the second wall;
the space between the metallised first wall and the second wall being filled by the solder in solid form, the solder in solid form being supported in the space by an adhesion force to the metallised wall in a form-fitting manner to provide a form-fitting connection between the circuit board and the peg,
the peg having an end including a detent lug extending partially into the space between the first and second walls and held in place by the solder in solid form to provide a form-fit in the direction of the longitudinal axis of the first wall; the connections of the peg to the circuit board being such that the peg is firmly connected to the circuit board in all three spatial directions and the connection is able to absorb turning moments without the peg becoming loosened from the hole.

12. The electrical component arrangement of claim 11 wherein the first metallised wall has circular cross-sections in planes at right angles to the longitudinal axes of the first and second walls and the peg has cross-sections at right angles to the longitudinal axes of the first and second walls that include (a) first and second spaced arcuate cut out portions that are concave with respect to the first wall and spaced from the first wall, and (b) a third arcuate portion having (i) opposite ends connected to end tips of the first and second arcuate portions and (ii) a shape geometrically similar to the shape of the first wall, the detent lug being diametrically opposite from the third arcuate portion.

13. The electrical component arrangement of claim 12 wherein the peg cross-sections at right angles to the longitudinal axes of the first and second walls include a straight portion opposite to the third arcuate portion, the detent lug extending beyond the straight portion away from the third arcuate portion.

14. The electrical component of claim 13 wherein the surface is the bottom surface of the circuit board.

15. The electrical component of claim 11 wherein the surface is the bottom surface of the circuit board.

16. The electrical component of claim 11 wherein the peg is made of plastic.

* * * * *